US011037862B2

United States Patent
Baueregger et al.

(10) Patent No.: US 11,037,862 B2
(45) Date of Patent: Jun. 15, 2021

(54) METHOD FOR ELECTRICALLY CONTACTING A COMPONENT BY GALVANIC CONNECTION OF AN OPEN-PORED CONTACT PIECE, AND CORRESPONDING COMPONENT MODULE

(71) Applicant: SIEMENS AKTIENGESELLSCHAFT, Munich (DE)

(72) Inventors: Hubert Baueregger, Kissing (DE); Volkmar Sommer, Munich (DE); Stefan Stegmeier, Munich (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

(21) Appl. No.: 15/578,867

(22) PCT Filed: May 23, 2016

(86) PCT No.: PCT/EP2016/061595
§ 371 (c)(1),
(2) Date: Dec. 1, 2017

(87) PCT Pub. No.: WO2016/193038
PCT Pub. Date: Dec. 8, 2016

(65) Prior Publication Data
US 2018/0158757 A1    Jun. 7, 2018

(30) Foreign Application Priority Data
Jun. 1, 2015   (DE) .................. 10 2015 210 061.8

(51) Int. Cl.
*H01L 23/49*    (2006.01)
*H01L 23/50*    (2006.01)
(Continued)

(52) U.S. Cl.
CPC .............. *H01L 23/49* (2013.01); *C25D 3/38* (2013.01); *C25D 5/18* (2013.01); *C25D 21/14* (2013.01);
(Continued)

(58) Field of Classification Search
None
See application file for complete search history.

(56) References Cited

U.S. PATENT DOCUMENTS 5,492,981 A    2/1996   Hoehn et al.
7,626,262 B2 * 12/2009  Otremba ............... H01L 24/33
                                                   257/737
(Continued)

FOREIGN PATENT DOCUMENTS

CN    1742119 A    3/2006
CN    1922730 A    2/2007
(Continued)

OTHER PUBLICATIONS

Japanese Office Action for Japanese Patent Application No. 2017-562693, dated Feb. 5, 2019, with English translation.
(Continued)

*Primary Examiner* — Robert K Carpenter
(74) *Attorney, Agent, or Firm* — Lempia Summerfield Katz LLC

(57) ABSTRACT

The invention relates to a method for electrically contacting a component (10) (for example a power component and/or a (semiconductor) component having at least one transistor, preferably an IGBT (insulated-gate bipolar transistor)) having at least one contact (40, 50), at least one open-pored contact piece (60, 70) is galvanically (electrochemically or free of external current) connected to at least one contact (40, 50). In this way, a component module is achieved. The contact (40, 50) is preferably a flat part or has a contact
(Continued)

surface, the largest planar extent thereof being greater than an extension of the contact (40, 50) perpendicular to said contact surface. The temperature of the galvanic connection is at most 100° C., preferably at most 60° C., advantageously at most 20° C. and ideally at most 5° C. and/or deviates from the operating temperature of the component by at most 50° C., preferably by at most 20° C., in particular by at most 10° C. and ideally by at most 5° C., preferably by at most 2° C. The component (10) can be contacted by means of the contact piece (60, 70) with a further component, a current conductor and/or a substrate (90). Preferably, a component (10) having two contacts (40, 50) on opposite sides of the component (10) is used, wherein at least one open-pored contact piece (60, 70) is galvanically connected to each contact (40, 50).

17 Claims, 5 Drawing Sheets

(51) Int. Cl.
    *H01L 23/495*    (2006.01)
    *H01L 23/498*    (2006.01)
    *H01L 23/00*     (2006.01)
    *C25D 3/38*     (2006.01)
    *C25D 5/18*     (2006.01)
    *C25D 21/14*    (2006.01)
    *H05K 3/42*     (2006.01)
    *H01L 23/492*    (2006.01)
    *H01L 23/373*    (2006.01)

(52) U.S. Cl.
CPC .... *H01L 23/4922* (2013.01); *H01L 23/49537* (2013.01); *H01L 23/49562* (2013.01); *H01L 23/49568* (2013.01); *H01L 23/49811* (2013.01); *H01L 23/50* (2013.01); *H01L 24/24* (2013.01); *H01L 24/29* (2013.01); *H01L 24/32* (2013.01); *H01L 24/33* (2013.01); *H01L 24/37* (2013.01); *H01L 24/40* (2013.01); *H01L 24/41* (2013.01); *H01L 24/75* (2013.01); *H01L 24/77* (2013.01); *H01L 24/82* (2013.01); *H01L 24/83* (2013.01); *H01L 24/84* (2013.01); *H01L 24/92* (2013.01); *H01L 24/97* (2013.01); *H05K 3/424* (2013.01); *H01L 23/3733* (2013.01); *H01L 23/3735* (2013.01); *H01L 23/49513* (2013.01); *H01L 24/05* (2013.01); *H01L 2224/04026* (2013.01); *H01L 2224/04034* (2013.01); *H01L 2224/05624* (2013.01); *H01L 2224/05639* (2013.01); *H01L 2224/05644* (2013.01); *H01L 2224/05647* (2013.01); *H01L 2224/24105* (2013.01); *H01L 2224/24227* (2013.01); *H01L 2224/24245* (2013.01); *H01L 2224/29111* (2013.01); *H01L 2224/29139* (2013.01); *H01L 2224/29144* (2013.01); *H01L 2224/29147* (2013.01); *H01L 2224/29155* (2013.01); *H01L 2224/3207* (2013.01); *H01L 2224/32227* (2013.01); *H01L 2224/32245* (2013.01); *H01L 2224/33181* (2013.01); *H01L 2224/373* (2013.01); *H01L 2224/37005* (2013.01); *H01L 2224/376* (2013.01); *H01L 2224/3719* (2013.01); *H01L 2224/3729* (2013.01); *H01L 2224/37111* (2013.01); *H01L 2224/37124* (2013.01); *H01L 2224/37139* (2013.01); *H01L 2224/37144* (2013.01); *H01L 2224/37147* (2013.01); *H01L 2224/37155* (2013.01); *H01L 2224/37166* (2013.01); *H01L 2224/37211* (2013.01); *H01L 2224/37224* (2013.01); *H01L 2224/37239* (2013.01); *H01L 2224/37244* (2013.01); *H01L 2224/37247* (2013.01); *H01L 2224/37255* (2013.01); *H01L 2224/37266* (2013.01); *H01L 2224/37395* (2013.01); *H01L 2224/4007* (2013.01); *H01L 2224/40227* (2013.01); *H01L 2224/40499* (2013.01); *H01L 2224/756* (2013.01); *H01L 2224/75703* (2013.01); *H01L 2224/776* (2013.01); *H01L 2224/77703* (2013.01); *H01L 2224/821* (2013.01); *H01L 2224/82101* (2013.01); *H01L 2224/831* (2013.01); *H01L 2224/834* (2013.01); *H01L 2224/836* (2013.01); *H01L 2224/83007* (2013.01); *H01L 2224/8349* (2013.01); *H01L 2224/8359* (2013.01); *H01L 2224/8385* (2013.01); *H01L 2224/83411* (2013.01); *H01L 2224/83424* (2013.01); *H01L 2224/83439* (2013.01); *H01L 2224/83444* (2013.01); *H01L 2224/83447* (2013.01); *H01L 2224/83455* (2013.01); *H01L 2224/83466* (2013.01); *H01L 2224/83511* (2013.01); *H01L 2224/83524* (2013.01); *H01L 2224/83539* (2013.01); *H01L 2224/83544* (2013.01); *H01L 2224/83547* (2013.01); *H01L 2224/83555* (2013.01); *H01L 2224/83566* (2013.01); *H01L 2224/83695* (2013.01); *H01L 2224/83907* (2013.01); *H01L 2224/841* (2013.01); *H01L 2224/84007* (2013.01); *H01L 2224/8485* (2013.01); *H01L 2224/8492* (2013.01); *H01L 2224/84951* (2013.01); *H01L 2224/9201* (2013.01); *H01L 2224/9205* (2013.01); *H01L 2224/9221* (2013.01); *H01L 2224/97* (2013.01); *H01L 2924/13055* (2013.01); *H01L 2924/13091* (2013.01); *H01L 2924/181* (2013.01)

(56) References Cited

U.S. PATENT DOCUMENTS

| | | | |
|---|---|---|---|
| 8,299,613 B2 * | 10/2012 | Oppermann | H01L 24/83 257/739 |
| 2007/0145536 A1 | 6/2007 | Nystrom | |
| 2007/0290337 A1 | 12/2007 | Otremba | |
| 2008/0001244 A1 | 1/2008 | Schwarzbauer | |
| 2010/0270673 A1 | 10/2010 | Oppermann | |
| 2014/0111956 A1 | 4/2014 | Taniguchi | |
| 2016/0225730 A1 | 8/2016 | Tatsumi | |

FOREIGN PATENT DOCUMENTS

| | | | |
|---|---|---|---|
| CN | 101351884 A | 1/2009 | |
| CN | 102265393 A | 11/2011 | |
| DE | 1226212 B | 10/1966 | |
| DE | 102007027378 A1 | 12/2007 | |
| DE | 102007055017 B4 | 11/2010 | |
| DE | 102011106294 A1 * | 1/2013 | ........... B23K 28/006 |
| EP | 0641826 A1 | 3/1995 | |
| JP | S5674932 A | 6/1981 | |
| JP | S5732422 A | 2/1982 | |
| JP | 2003218303 A | 7/2003 | |
| JP | 2006010843 A | 1/2006 | |
| JP | 2007335473 A | 12/2007 | |
| JP | 2009164240 A | 7/2009 | |
| WO | WO2010050395 A1 | 5/2010 | |
| WO | WO2010072555 A1 | 7/2010 | |
| WO | WO2010091660 A2 | 8/2010 | |

(56) References Cited

FOREIGN PATENT DOCUMENTS

WO  WO2015053356 A1  4/2015
WO  WO2015086184 A1  6/2015

OTHER PUBLICATIONS

German Search Report for related German Application No. 10 2015 210 061.8 dated Feb. 18, 2016.
PCT International Search Report and Written Opinion of International Searching Authority dated Nov. 11, 2016 corresponding to PCT International Application No. PCT/EP2016/061595 filed May 23, 2016.
Written Opinion of International Searching Authority dated Sep. 1, 2016 corresponding to PCT International Application No. PCT/EP2016/061595 filed May 23, 2016.
Chinese Office Action for Chinese Application No. 201680031979.6 dated Sep. 24, 2019.
Chinese Office Action for Chinese Application No. 201680031979.6 dated Jan. 15, 2021.

* cited by examiner

METHOD FOR ELECTRICALLY CONTACTING A COMPONENT BY GALVANIC CONNECTION OF AN OPEN-PORED CONTACT PIECE, AND CORRESPONDING COMPONENT MODULE

This application is the National Stage of International Application No. PCT/EP2016/061595, filed May 23, 2016, which claims the benefit of German Patent Application No. 10 2015 210 061.8, filed Jun. 1, 2015. The entire contents of these documents are hereby incorporated herein by reference.

BACKGROUND

The present embodiments relate to a method for electrically contacting a component with an electrically conductive contact, and to a component module with a component having at least one electrically conductive contact.

In the field of microsystems technology and power electronics, electrical contacts of passive components such as resistors, and of semiconductor components such as IGBTs, diodes, MOSFETS, LEDs, and substrates, such as FR4, DCB, ANM and lead frames, are electrically connected to each other by an assembly and connection technology.

For electrically contacting to substrates, known methods include gluing using conductive adhesives, soldering of "preforms", soldering using solder pastes, and diffusion soldering and sintering. In diffusion soldering and sintering, the component contacts are also to withstand elevated temperatures.

Contacts that are remote from the substrate, by contrast, are typically implemented using techniques such as wire-bond technology (also, "tape-bond technology"), pressure-contact technology supported by compensation elements, such as molybdenum, or with planar technologies (e.g., SiPLIT, Skin and DirectFET). Contacting by pressure sintering or low-pressure sintering, however, tends to produce electrical contacts that are susceptible to distortion and fracture-prone. In addition, such sintering methods are costly in terms of equipment and time-consuming. In addition, soldering and sintering methods disadvantageously entail a high-temperature input into the components to be contacted and may not therefore be used for heat-sensitive components. Moreover, electroplating, diffusion soldering, and sintering are very time-consuming processes.

With clamped, spring-loaded, or crimped connections, the fixing requires considerable installation effort, especially when contacting multiple contact points. In addition, owing to the risk of damage to components due to irregular pressure forces, these contacting procedures are not very reliable.

The method of contacting with compressible soldering materials (such as "Heatspring", marketed by the company Indium Corporation) results in contacts with low electrical conductivity and is also time-consuming and expensive.

A disadvantage of the known methods is, therefore, that for the electrical contacting to and remote from the substrates, the following requirements are difficult to satisfy simultaneously: the simultaneous production of a plurality of contacts; without high temperature input; without high pressure input; in the time range from seconds to a few minutes; with large contact surfaces; and high temperature resistance.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method for electrically contacting a component with at least one conductive contact that does not suffer from the aforementioned disadvantages is provided. For example, the method according to one or more of the present embodiments enables a plurality of contacts to be contacted at the same time without high temperature or pressure input, over a large surface area, rapidly and in a temperature-resistant manner. In another example, a component module with electrical contacts that are contacted in the above manner is provided.

The method according to one or more of the present embodiments is a method for electrically contacting a component that has at least one electrical contact. In the method according to one or more of the present embodiments, at least one open-pored contact piece is galvanically connected to the at least one contact. The open-pored nature of the contact piece provides numerous passages for electrolyte fluid, which may therefore access the boundary surface between contact piece and electrical contact of the component from the outside. The open-pored material of the contact piece has an open-cell structure, through which electrolyte may pass particularly efficiently.

The method according to one or more of the present embodiments may be carried out without high temperature input in components to be contacted that are at least potentially susceptible to heat, because galvanic methods are typically carried out at relatively low temperatures not exceeding 150° C.

In one embodiment, by the method, high pressure loading of components may be easily avoided, since the implementation of galvanic methods requires either no or at most very low compressive forces.

Using the method according to one or more of the present embodiments, permanently elastic, resilient contacts may be realized very easily, since open-pored materials typically have precisely such resilient, elastic material properties.

The phrase "galvanically connected" may be understood as "connected by galvanic methods" or "connected via electroplating"; the galvanic connection may be effected by an electrolytic fluid (e.g., by an electrolytic bath).

In the method according to one or more of the present embodiments, electrolytic fluid may be introduced into open pores of the open-pored contact piece.

The phrase "open-pored contact piece" is understood to be a contact piece in which pores penetrate from the outside of the contact piece to the inside.

In the method according to one or more of the present embodiments, the contact piece may be galvanically connected, where a material of a type that is the same as a type of material from which the contact piece and/or the electrical contact of the component is formed is deposited.

In the method according to one or more of the present embodiments, a type of component is used in which the at least one contact is a flat part. Alternatively or in addition, the contact may have a contact surface, the largest planar extension of which is larger than an extension of the contact perpendicular to this contact surface.

It is, for example, in the contacting of surface contacts where the method according to one or more of the present embodiments proves to be particularly advantageous, since a planar contact may be readily achieved by this method. For example, heat-conducting contacts may be easily achieved in this way, because planar contacts already have strong heat conducting properties as a result of spatial geometry. The thermal conductivity necessary for the heat distribution is normally already present, since a good electrical conductivity for contacting and a good thermal conductivity desirable for heat distribution for typical materials typically co-occur.

In the method according to one or more of the present embodiments, an electrically conductive contact piece is used as the at least one contact piece. In this extension of the method according to one or more of the present embodiments, the contacts may be realized very quickly, since all that is to be implemented is an electrically conductive connection by the material deposited at the contact site. In this extension of the method according to one or more of the present embodiments, a deposition of larger quantities of material is unnecessary, since the contact piece itself already constitutes a large-area conducting path.

In an advantageous extension of the method according to one or more of the present embodiments, the at least one open-pored contact piece is formed from or with porous material.

In the method according to one or more of the present embodiments, the at least one open-pored contact piece is formed from or with metal (e.g., nickel and/or silver and/or gold and/or tin and/or copper).

In the method according to one or more of the present embodiments, the at least one open-pored contact piece is formed with a tissue-like and/or foam-like and/or mesh-like structure.

In an extension of the method according to one or more of the present embodiments, the at least one open-pored contact piece is galvanically connected to the contact at a temperature not exceeding 100° C. (e.g., not exceeding 60° C., not exceeding 20° C., or not exceeding 5° C.) and/or deviating from the operating temperature of the component by no more than 20° C. (e.g., by no more than 10° C., 5° C., or 2° C.). When operating at low temperatures, the temperature input into the component during the implementation of the method may be kept particularly low. It is for temperature-sensitive components that this extension of the method according to one or more of the present embodiments may be provided. At the smallest possible temperature difference between galvanic connection and subsequent operating temperature, the component is connected in a particularly stress-free manner. For designated operating temperatures of the component at temperatures greater than 100° C., the galvanic connection may be performed at temperatures above 100° C., where molten salt-based metal deposition methods are then advantageously used.

In a suitable manner, in the method according to one or more of the present embodiments, the at least one open-pored contact piece is galvanically connected by an electro-chemical plating method.

In this extension of the method according to one or more of the present embodiments, an electrically conductive contact piece is used, where metal is deposited on the contact piece by the electro-chemical plating method. In the method according to one or more of the present embodiments, an anode that is formed with the same type of metal as is to be deposited on the contact piece as part of the method is used. In one embodiment, this metal is copper. Alternatively, the metal used is nickel and/or silver and/or gold and/or tin.

Alternatively, in the method according to one or more of the present embodiments, the at least one open-pored contact piece is galvanically connected by a procedure that is free of external current (e.g., using transfer metallization and/or using reduction metallization and/or using contact metallization). In the external current-free electroplating procedure, the deposition of metal may be carried out at an operating temperature that is approximately equal to the subsequent operating temperature of the component. As a result, mechanical stresses may be reduced or prevented. In addition, a corrosion protection may also be implemented (e.g., by the electroplating of nickel or nickel and gold). A further advantage of the external current-free procedure is that the component itself does not need to be electrically contacted. Therefore, time-consuming deposits of seed layers and contacting measures are not required.

In an extension, a contact piece that does not initially form a continuous conduction path (e.g., is not conductive at the macroscopic level) is used. Instead, the contact piece has a plurality of metallic islands that only form a continuous conduction path to a certain extent as metallization islands during the electroplating process, which is free of external current.

In one embodiment, in the method according to one or more of the present embodiments, the component is contacted with another component and/or current conductor and/or with a substrate by the contact piece, whereupon the contact piece and/or the component and/or the other component and/or current conductor and/or substrate are coated with an electrical insulation layer.

In one embodiment, in the method according to one or more of the present embodiments, the insulation layer is formed by casting and/or molding and/or from or with siloxanes and/or polymers.

In an advantageous extension of the method according to one or more of the present embodiments, a power component is used as the component.

In the method according to one or more of the present embodiments, a component having at least one transistor (e.g., a bipolar transistor with an insulated gate electrode ("insulated-gate bipolar transistor": IGBT)) is used as the component.

In one embodiment, in the method according to one or more of the present embodiments, a component having two contacts is used. The contacts may be on opposite sides (e.g., flat sides of the component. At least one open-pored contact piece is galvanically connected to these contacts (e.g., at least one open-pored contact piece per contact) in each case according to, for example, a method according to one or more of the present embodiments, as previously described.

The component module according to one or more of the present embodiments includes a component having at least one electrical contact. According to the present embodiments, at least one open-pored contact piece is galvanically connected to the electrical contact.

The component module according to one or more of the present embodiments may be formed by a method according to the present embodiments, as described above.

In an extension of the component module according to the present embodiments, the component is implemented in the manner of a stack. The layers of the stack is formed by printed circuit boards and/or substrates, on which components are connected by contact pieces. For this purpose, the contacts of components on all layers are contacted by the method according to the present embodiments at the same time.

In another extension of the component module according to the present embodiments, a plurality of components is jointly connected to a flat side of a substrate or a circuit board. In this configuration also, the plurality of components may be contacted at the same time by the method according to the present embodiments.

DETAILED DESCRIPTION

Figure 1:
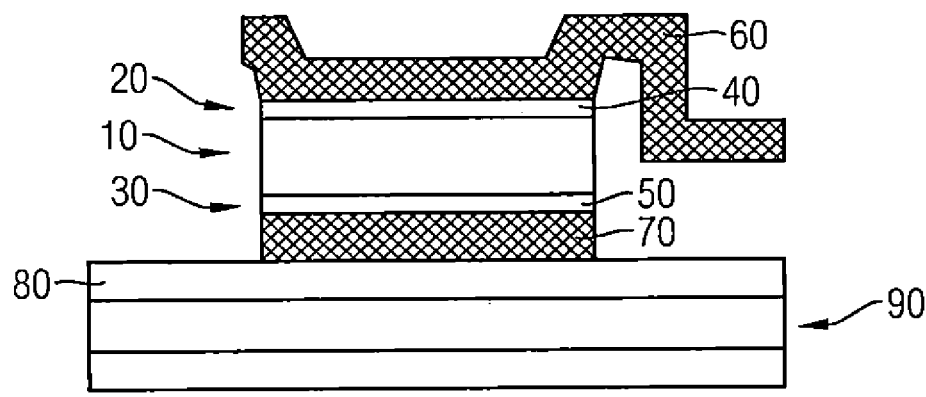
FIG. 1 shows one embodiment of an arrangement of a power component on a ceramic substrate prior to the implementation of a first exemplary embodiment of the method for producing a first exemplary embodiment of a component module, shown in cross section.

The power component 10 shown in FIG. 1 is a bipolar transistor with insulated gate electrode (e.g., "insulated-gate bipolar transistor": IGBT) and has a first flat side 20 and a second flat side 30 that face away from one another. Thin-film-like surface contacts 40, 50 of the power component 10, which are configured as two-dimensional chip metallizations, extend along the first flat side 20 and the second flat side 30. In the exemplary embodiment illustrated, the surface contact 40 of the power component 10, arranged on the top side in FIG. 1, is made of copper, while the surface contact 50 of the power component 10 positioned on the underside is made of silver. Top-mounted surface contacts may also be formed with silver or from or with AlSiCu, or other metals or other electrically conductive materials, while the underside surface contacts may also be formed from or with gold or other metals or other electrically conductive materials.

For contacting these surface contacts 40, 50, contact pieces 60, 70 of open-pored material that extend substantially in a planar fashion along the surface contacts 40, 50 are placed on the surface contacts 40, 50. In the exemplary embodiment illustrated, the contact pieces 60, 70 are conductive and implemented as conductive copper sponges. In other exemplary embodiments, not separately shown, which correspond to the exemplary embodiments described by reference to the figures, the open-pored contact pieces 60, 70 may also consist of other open-pored conductive materials, such as contact pieces made of aluminum, Ti, or from or with other metals, implemented in the form of meshes or tissues or other porous structures. For example, polymer sponges either partially coated with conductive materials or packed with conductive particles may also be used as contact pieces.

One of the surface contacts 50 of the power component 10 faces towards another surface contact 80 of a ceramic substrate 90 having a ceramic core 100 of aluminum nitride (AlN). In other exemplary embodiments, the ceramic core 100 may consist of another ceramic material, or else of printed circuit board materials such as FR 4 or other substrates made of silicone and/or epoxy. The other surface contact 80 of the ceramic substrate 90 is implemented as a superficial substrate metallization, in the exemplary embodiment illustrated, as a copper substrate metallization. The surface contact 50 of the power component 10 facing towards the ceramic substrate 90 and the other surface contact 80 of the ceramic substrate 90 extend parallel to one another and therefore form a level gap. The contact piece 70 arranged on the contact surface 50 facing towards the ceramic substrate 90 completely fills this level gap and rests with a whole surface against this surface contact 50 of the power component 10, and against the other surface contact 80 of the ceramic substrate 90. The contact piece 70 is therefore arranged to contact the power component 10 and the ceramic substrate 90.

Figure 2:
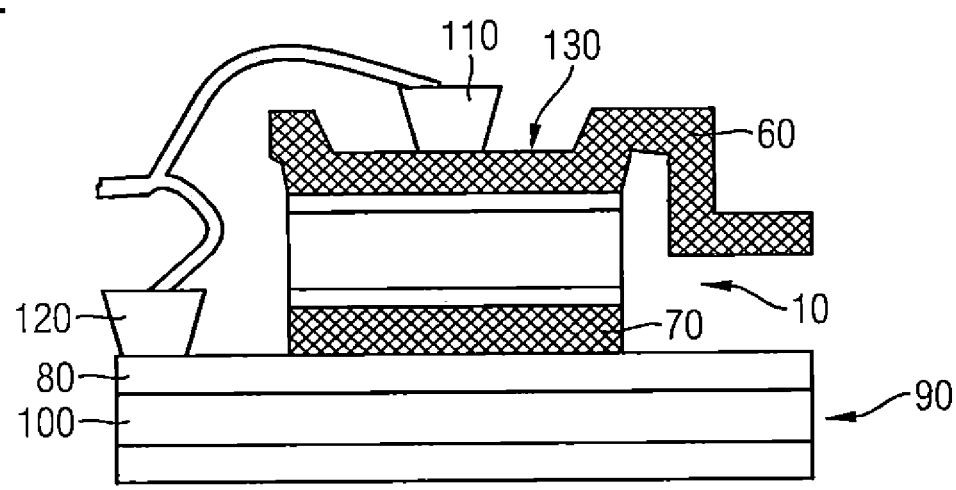
FIG. 2 shows one embodiment of the arrangement of the power component in accordance with FIG. 1 during an implementation of a first act of the method shown in cross section.

In a further method act, the open-pored contact pieces 60, 70 are contacted with electrodes 110, 120 (FIG. 2). On the particular contact piece 60 that is arranged on the surface contact 40 facing away from the ceramic substrate 90, a first electrode 110 is electrically contacted on an outer side 130 (e.g., the side remote from the power component 10). A further, second, electrode 120 is electrically contacted on the copper surface contact 80, which is located on the contact piece positioned between power component 10 and the ceramic substrate 90. The first electrode 110 also acts as a fixing element, which provides the fixing of the power module formed by the power component 10, the ceramic substrate 90, and the contact pieces 60, 70 during the method according to one or more of the present embodiments. A force is applied to the first electrode 110 in the direction of the ceramic substrate 90 by a clamping device, not shown separately. Alternatively, in a further exemplary embodiment that corresponds to the exemplary embodiment shown, the electrode 110 may be configured not as a fixing element, where the contact pieces 60, 70 are instead fixed by a conductive adhesive. As a result of the conductivity of the adhesive, the contact pieces 60, 70 may be simply electrically contacted.

Figure 3:
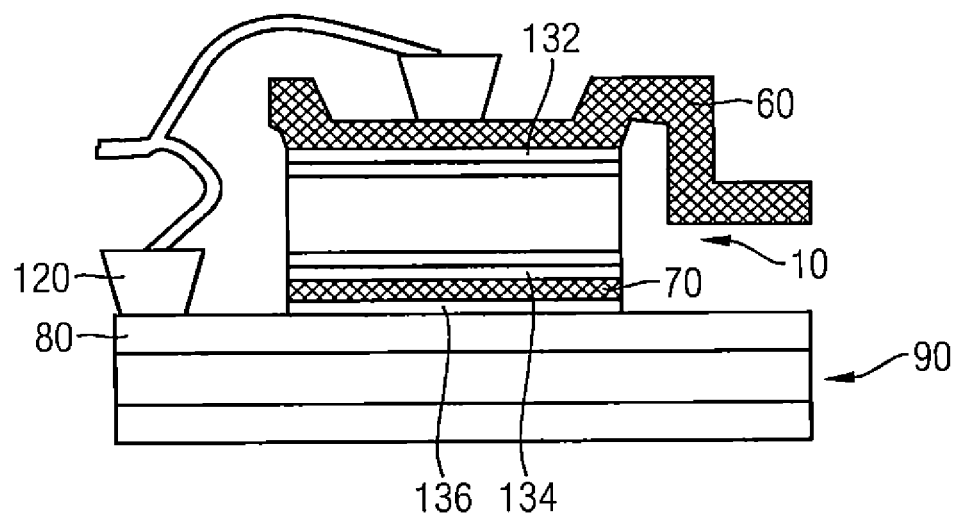
FIG. 3 shows one embodiment of the arrangement of the power component in accordance with FIG. 1 after implementation of the first act of the method, shown in cross section.

As a result of the contacting of the open-pored contact pieces with electrodes 110, 120, by the known electrochemical plating process, metal (e.g., copper) is deposited in the region between the open-pored contact pieces 60, 70 and the surface contacts 40, 50, 80 (FIG. 3). In the illustrated exemplary embodiment, the deposited material forms layers 132, 134, 136 that extend in a planar manner along the chip metallizations or ceramic substrate metallizations and the contact pieces 60, 70. As a result of this deposition, the open-pored contact pieces 60, 70 become connected to the power component 10 at the same time. All of the contact pieces 60, 70 are connected simultaneously to the respective contacts 40, 50, 80, on which the contact pieces 60, 70 each rest.

Figure 4:
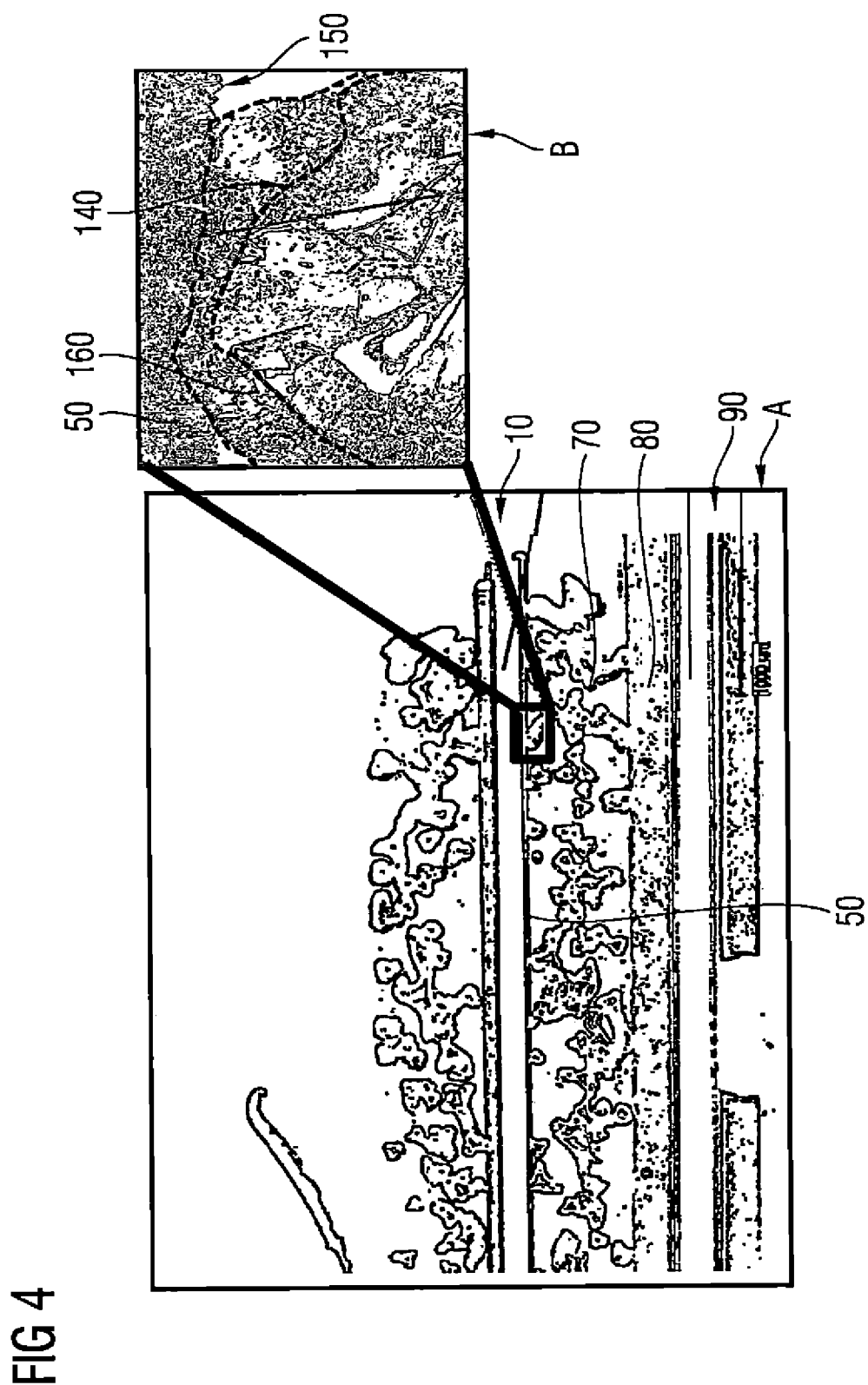
FIG. 4 shows a detailed enlargement (A) of FIG. 3, together with a detail (B) from this detailed enlargement.

A component contact between the power component 10, the contact piece 70, and the ceramic substrate 90 realized in accordance with the previously described exemplary embodiment is shown enlarged in FIG. 4A in a detail containing an actual image. The detail shows the connection of the contact piece 70 located between the power component 10 and the ceramic substrate 90. The detail shown in FIG. 4B illustrates the connection of the contact piece 70 to the power component 10. Between the side 140 of the contact piece 70 facing the power component 10 and the side 150 of the chip metallization of the power component 10 facing the contact piece 70, a grain growth of interstitial copper has taken place in the course of the galvanic connection, which fills up the intermediate region 160 with metal.

Figure 5:
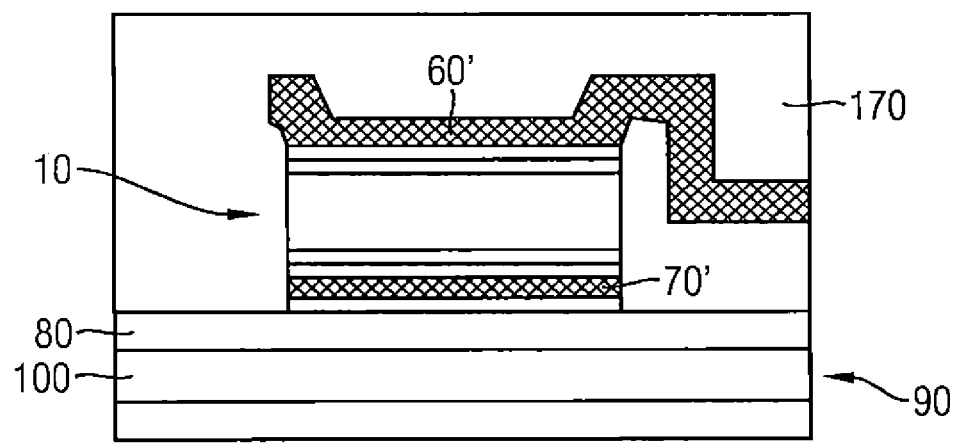
FIG. 5 shows the component module according to an embodiment after the method acts in accordance with FIGS. 1 to 4 in a schematic diagram in cross section.

In a subsequent processing act, the power modules according to one or more of the present embodiments formed by the ceramic substrate 90 and the contacted power component 10 are encapsulated with insulating material 170 (e.g., a siloxane (FIG. 5)). In other exemplary embodiments, a different insulating material 170 is used (e.g., a polymer).

Figure 6:
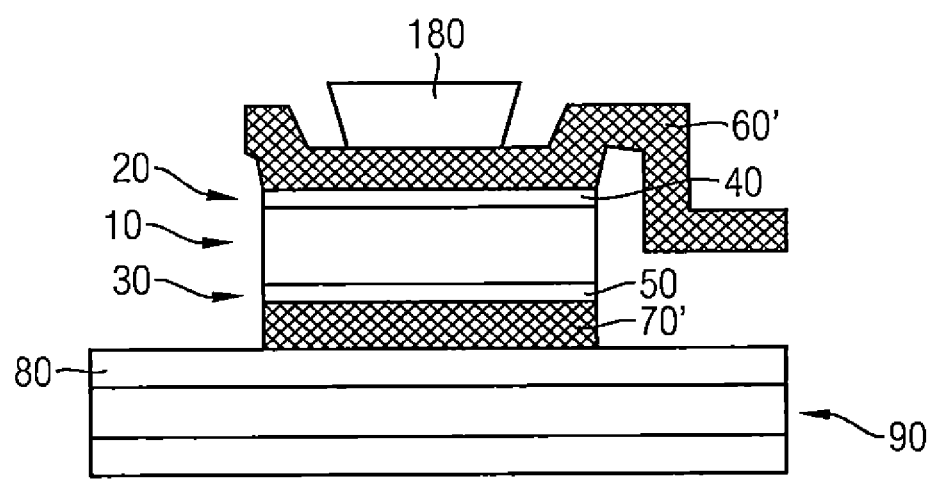
FIG. 6 shows a further view of an arrangement of a power component on a ceramic substrate prior to the implementation of a further exemplary embodiment of the method for producing a further exemplary embodiment of the component module, shown in cross section.
Figure 7:
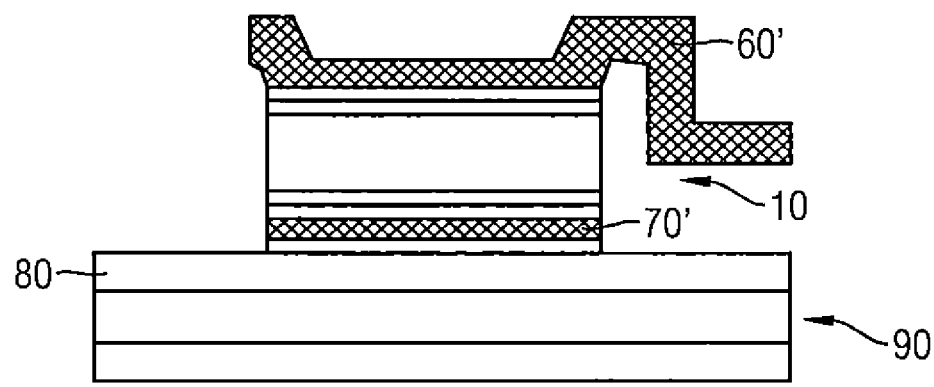
FIG. 7 is a schematic sketch of the power component in accordance with FIG. 6 during an implementation of a first act of the further exemplary embodiment of the method, shown in cross section.
Figure 8:
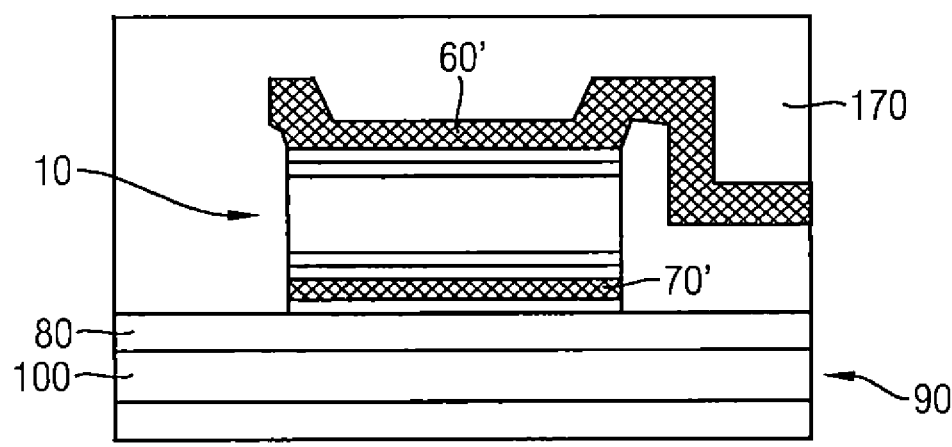
FIG. 8 is a schematic diagram of the further exemplary embodiment of the component module after the method acts in accordance with FIGS. 6 and 7, shown in cross section.

In a further exemplary embodiment shown in FIGS. 6 to 8, instead of an electrochemical plating process, an external current-free electroplating process is used. Accordingly, this exemplary embodiment differs from the exemplary embodiment shown in FIGS. 1 to 5 in that, as is known, no contacting with electrodes 110, 120 is required for external current-free plating processes. Consequently, instead of the first electrode 110, only a fixing element 180 is present (FIG. 6). A force is applied to the fixing element 180 in the direction of the ceramic substrate 90 by a clamping device, not shown separately, so that the power module is held together during the method. Alternatively, in a further exemplary embodiment, no fixing element 180 is provided. The contact pieces 60', 70' are instead fixed in place using an adhesive (e.g., using a small dot of adhesive).

Using the external current-free electroplating process, metal (e.g., copper) is deposited according to a known method in the region between the open-pored contact pieces 60', 70' and the power component 10 (FIG. 7). In the illustrated exemplary embodiment, the deposited material forms layers that extend in a planar manner along the chip metallizations or ceramic substrate metallizations and the contact pieces 60', 70'. As a result of this deposition, the open-pored contact pieces 60', 70' become connected to the power component 10 at the same time.

In a further exemplary embodiment, which corresponds to the exemplary embodiment described based on FIGS. 6 to 8, a contact piece that does not initially form a continuous conduction path is used. Instead, the contact piece has a plurality of copper metallic islands that, as described earlier, only form a continuous conduction path to a certain extent as metallization islands during the external current-free electroplating process.

In a subsequent processing act, the power modules according to one or more of the present embodiments formed by the ceramic substrate 90 and the contacted power component 10 are encapsulated with the insulating material 170 (e.g., a siloxane (FIG. 8)). In other exemplary embodiments, a different insulating material 170 is used (e.g., a polymer).

In the same way as the above-described exemplary embodiments, in other exemplary embodiments, the galvanized metal may also be a different metal instead of copper.

In other exemplary embodiments, not shown separately, a power module according to one or more of the present embodiments may be implemented with a plurality of ceramic or other substrates, piled up in the form of a stack. Electronic contacts may be implemented in a plurality of layers at the same time by the method according to one or more of the present embodiments. Alternatively or additionally, using the method according to one or more of the present embodiments, a plurality of components in a single layer may be contacted at the same time.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for electrically contacting a component having a first component surface, a second component surface opposite the first component surface, and at least two electrical contacts, each of the at least two electrical contacts having a first contact surface and a second contact surface opposite the first contact surface, the second contact surface of a first electrical contact of the at least two electrical contacts being in contact with the first component surface of the component and the second contact surface of a second electrical contact of the at least two electrical contacts being in contact with the second component surface of the component, the method comprising:
   galvanically connecting a first open-pored contact piece to the first contact surface of the first electrical contact and a second open-pored contact piece to the first contact surface of the second electrical contact of the at least two electrical contacts of the component, each of the first open-pored contact piece and the second open-pored contact piece having a plurality of open pores prior to being galvanically connected to the first electrical contact or the second electrical contact of the at least two electrical contacts.

2. The method of claim 1, wherein each of the first electrical contact and the second electrical contact of the at least two electrical contacts is a flat part, has a respective contact surface, a largest planar extension of which is larger than an extension of the respective contact perpendicular to the respective contact surface, or a combination thereof.

3. The method of claim 1, wherein an electrically conductive contact piece is used as the first open-pored contact piece or the second open-pored contact piece.

4. The method of claim 1, wherein the first open-pored contact piece and the second open-pored contact piece is formed from or with porous material.

5. The method of claim 1, wherein the first open-pored contact piece or the second open-pored contact piece is formed from or with metal.

6. The method of claim 5, wherein the metal includes nickel, silver, gold, tin, copper, or any combination thereof.

7. The method of claim 1, wherein the first open-pored contact piece and the second open-pored contact piece is formed with a tissue structure, a foam structure, a mesh structure, or any combination thereof.

8. The method of claim 1, wherein galvanically connecting the first open-pored contact piece and the second open-pored contact piece comprises galvanically connecting the first open-pored contact piece to the first electrical contact and the second open-pored contact piece to the second electrical contact of the at least two electrical contacts at a temperature not exceeding 100° C., deviating from an operating temperature of the component by no more than 50° C., or a combination thereof.

9. The method of claim 8, wherein galvanically connecting the first open-pored contact piece and the second open-pored contact piece comprises galvanically connecting the first open-pored contact piece to the first electrical contact and the second open-pored contact piece to the second electrical contact of the at least two electrical contacts at a temperature not exceeding 5° C., deviating from the operating temperature of the component by no more than 2° C., or a combination thereof.

10. The method of claim 1, wherein galvanically connecting the first open-pored contact piece or the second open-pored contact piece comprises galvanically connecting the first open-pored contact piece or the second open-pored contact piece using an electrochemical plating process.

11. The method of claim 1, wherein galvanically connecting the first open-pored contact piece or the second open-pored contact piece comprises galvanically connecting the first open-pored contact piece to the first electrical contact and the second open-pored contact piece to the second electrical contact of the at least two electrical contacts by a method free of external current.

12. The method of claim 11, wherein the method free of external current includes transfer metallization, reduction metallization, contact metallization, or any combination thereof.

13. The method of claim 1, wherein the component is contacted with another component, a current conductor, with a substrate, or any combination thereof by one of the first open-pored contact piece or the second open-pored contact piece, and
wherein the method further comprises coating the one of the first open-pored contact piece or the second open-pored contact piece, the component, the other component, the current conductor, the substrate, or any combination thereof with an electrical insulation layer.

14. The method of claim 13, wherein the coating comprises forming the electrical insulation layer, forming the electrical insulation layer comprising casting the insulation layer, molding the insulation layer, forming the insulation layer from or with siloxanes, polymers, or silxanes and polymers, or any combination thereof.

15. The method of claim 1, wherein a power component is used as the component.

16. The method of claim 1, wherein a component having at least one transistor is used as the component.

17. The method of claim 1, wherein the first contact surface of the first electrical contact is a top surface and the second contact surface of the first electrical contact is a bottom surface.

* * * * *